US 6,606,364 B1

(12) United States Patent
Walley et al.

(10) Patent No.: US 6,606,364 B1
(45) Date of Patent: Aug. 12, 2003

(54) MULTIPLE DATA RATE BIT SYNCHRONIZER HAVING PHASE/FREQUENCY DETECTOR GAIN CONSTANT PROPORTIONAL TO PLL CLOCK DIVIDER RATIO

(75) Inventors: George M. Walley, San Jose, CA (US); Roy A. Vaninetti, Palm Bay, FL (US); Laurence S. D'Agati, Melbourne, FL (US)

(73) Assignee: Harris Corporation, Melbourne, FL (US)

( * ) Notice: Subject to any disclaimer, the term of this patent is extended or adjusted under 35 U.S.C. 154(b) by 0 days.

(21) Appl. No.: 09/262,514

(22) Filed: Mar. 4, 1999

(51) Int. Cl.[7] ................................. H03D 3/24
(52) U.S. Cl. ................................. 375/376; 375/375
(58) Field of Search .................. 375/376, 374, 375/375, 354; 331/1 R, 172, 12, 9, 18, 25, 17; 455/260, 200

(56) References Cited

U.S. PATENT DOCUMENTS

| | | | | |
|---|---|---|---|---|
| 5,307,071 A | * | 4/1994 | Arnold et al. | 342/103 |
| 5,369,376 A | * | 11/1994 | Leblebicioglu | 331/8 |
| 5,406,591 A | * | 4/1995 | Watanabe | 375/120 |
| 5,459,756 A | | 10/1995 | Stilwell et al. | 375/376 |
| 5,485,484 A | | 1/1996 | Williams et al. | 375/376 |
| 5,525,935 A | | 6/1996 | Joo et al. | 331/11 |
| 5,566,204 A | * | 10/1996 | Kardontchik et al. | 375/219 |
| 5,590,157 A | | 12/1996 | Schuur | 375/327 |
| 5,604,926 A | * | 2/1997 | Pace et al. | 455/260 |
| 5,754,598 A | * | 5/1998 | Barrett, Jr. et al. | 375/327 |
| 5,781,054 A | * | 7/1998 | Lee | 327/231 |
| 5,783,971 A | * | 7/1998 | Dekker | 331/17 |
| 5,831,483 A | * | 11/1998 | Fukuda | 331/17 |
| 5,945,854 A | * | 8/1999 | Sadowski | 327/156 |
| 6,044,123 A | * | 3/2000 | Takla | 375/376 |
| 6,052,034 A | * | 4/2000 | Wang et al. | 331/2 |
| 6,154,071 A | * | 11/2000 | Nogawa | 327/156 |
| 6,160,861 A | * | 12/2000 | McCollough | 375/376 |
| 6,236,275 B1 | * | 5/2001 | Dent | 331/1 A |
| 6,292,507 B1 | * | 9/2001 | Hardin et al. | 375/130 |
| 6,327,463 B1 | * | 12/2001 | Welland | 455/260 |

* cited by examiner

Primary Examiner—Don N. Yo
Assistant Examiner—Dung X. Nguyen
(74) Attorney, Agent, or Firm—Allen, Dyer, Doppelt, Milbrath & Gilchrist, P.A.

(57) ABSTRACT

The bandwidth of a 'single loop' bit synchronizer is maintained constant over a relatively wide baud rate range, by making the loop's phase/frequency detector gain constant proportional to the loop's clock divider ratio. The phase/frequency detector may include charge pump that charges a capacitor with a current representative of the phase/frequency difference between an input data signal and the clock signal produced by the loop's clock divider. By resistor-coupling the loop filter to the capacitor, the loop filter sees a voltage that is proportional to the integral of the phase/frequency detector's output current over the symbol period of the received data signal. Since the data symbol period is the inverse of the data rate, and corresponds to the ratio of the clock frequency divisor N to the fixed output frequency produced by the VCO, the gain constant of the phase detector is proportional to the clock divisor N. Since loop bandwidth is defined in accordance with the ratio of the phase detector gain constant (which is proportional to N) to the clock divisor N, the contribution of the clock frequency divisor N is canceled, so that the loop bandwidth can be maintained constant regardless of data rate (which sets N).

15 Claims, 1 Drawing Sheet

MULTIPLE DATA RATE BIT SYNCHRONIZER HAVING PHASE/FREQUENCY DETECTOR GAIN CONSTANT PROPORTIONAL TO PLL CLOCK DIVIDER RATIO

FIELD OF THE INVENTION

The present invention relates in general to communication systems, and is particularly directed to a new and improved bit synchronizer having only a single a phase locked loop, the bandwidth of which is maintained constant over a relatively wide baud rate range, by making the loop's phase/frequency detector gain constant proportional to the loop's clock divider ratio.

BACKGROUND OF THE INVENTION

In order to recover and synchronize to the embedded clock of a received data communication signal (and thereby accurately sample the received signal to extract the data), digital communication receivers have customarily employed a digitally programmable (numerically controlled) phase locked loop (PLL) of the type shown diagrammatically in FIG. 1. This standard PLL configuration includes a stable clock signal generator (voltage-controlled oscillator—VCO) 10, the clock frequency output of which is relatively high compared to the range of data rates capable of being received. The VCO output clock signal is selectively (programmably) divided down by a clock divisor N to a data-rate associated clock frequency by a programmable divider 12, in order to derive an output clock signal having the same frequency as, and which is to be synchronized with the clock signal embedded in the incoming data signal applied to an input terminal 11.

The incoming data signal at terminal 11 is coupled to a first input 15 of a phase/frequency detector 16, a second input 17 of which is coupled to receive the divided-down clock signal from the programmable divider 12. The phase/frequency detector 16 produces an output that is representative of the phase/frequency differential between the two signals, and couples this output through a loop filter 18 (customarily implemented as an operational amplifier-based circuit) to the VCO 10. An input data signal DATA may be sampled by means of a flip-flop 19, which is clocked with the output clock signal from the divider 12.

Now although the loop parameters of the PLL configuration of FIG. 1 can be tailored to achieve satisfactory performance over a reasonably narrow bandwidth, such is not the case if the same loop is expected to handle data rates that may vary over multiple orders of magnitude. A principal reason for this shortcoming is the fact that the loop's parameters are based upon the divisor ratio of the clock frequency divider 12, and will change if the clock divisor N is varied substantially to accommodate a significant change in data rate. Such a variation in the loop parameters means that neither the loop bandwidth nor its damping constant can be maintained constant as required.

Conventional 'single loop' proposals to handle this problem have included the use of a complex loop filter configuration, the parameters of which are controllably adjusted (such as through an arrangement of switched resistor networks), when the data rate is to be changed. Alternative 'multi-loop' proposals employ a plurality of phase locked loops having respectively different transfer function parameters (e.g., respectively different, 'fixed' loop gain constants that are associated with respectively different frequency 'bins' of the overall baud range). The signal processing path for the received signal through a selected one of these PLLs is controllably switched in accordance with that portion of the baud range in which the received signal's clock is located. It will be readily appreciated that such conventional multiple data rate bit synchronizers are relatively complex from a circuit implementation standpoint, both in terms of hardware and control software, and are therefore costly to implement and calibrate.

SUMMARY OF THE INVENTION

In accordance with the present invention, such drawbacks of both single loop and multiple loop clock recovery circuits are effectively obviated by a new and improved 'single loop' bit synchronizer, the phase/frequency detector of which has a gain constant that is proportional to the loop's clock divider ratio. In accordance with a preferred embodiment of the invention, this gain constant proportionality is readily accomplished by implementing the phase detector to include a (current mirror-based) charge pump that is operative to charge a capacitor with a current that is representative of the frequency difference between the input data signal and the clock signal produced by the loop's clock divider.

By resistor-coupling the loop filter to the capacitor, the loop filter sees a voltage that is proportional to the integral of the phase detector's output current over the symbol period of the received data signal. As the data symbol period is the inverse of the data rate, it effectively corresponds to the ratio of the clock frequency divisor N to the fixed output frequency produced by the VCO, making the gain constant of the phase detector proportional to the clock divisor N. Since loop bandwidth is defined in accordance with the ratio of the phase detector gain constant (which is proportional to N) to the clock divisor N, the contribution of the divisor N is effectively canceled, so that the loop bandwidth can be maintained constant regardless of data rate (which sets N).

DETAILED DESCRIPTION

Figure 1:
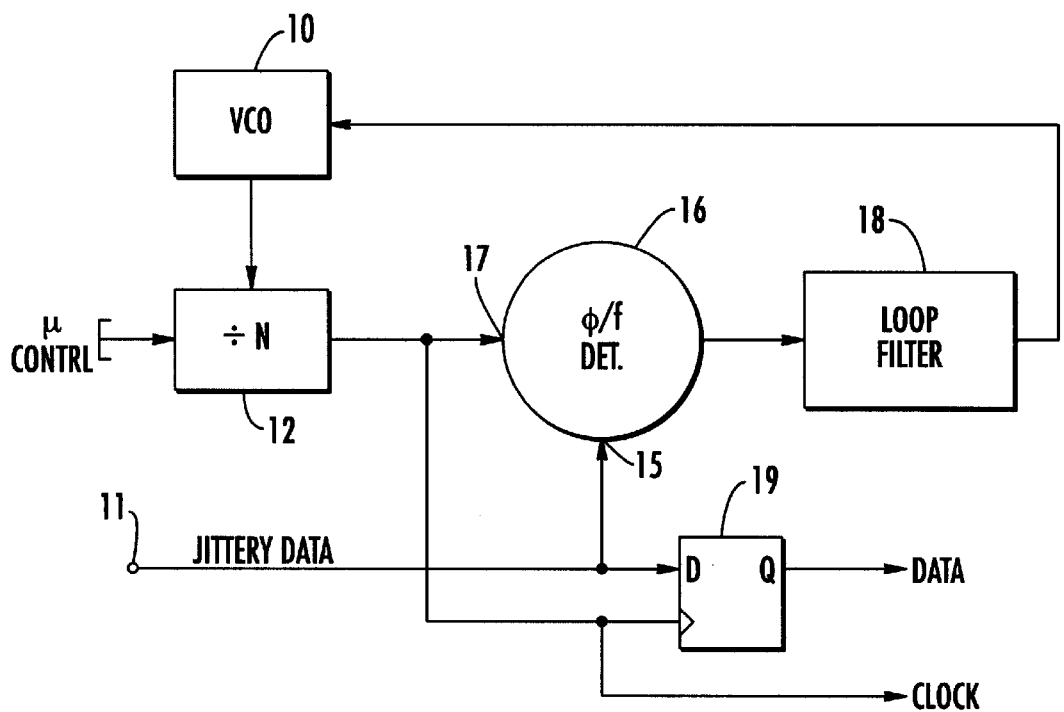
FIG. 1 diagrammatically illustrates a conventional digitally programmable phase locked loop.

Before describing in detail the constant loop bandwidth, variable data rate bit synchronizer of the present invention, it should be observed that the invention resides primarily in what is effectively a prescribed arrangement of conventional communication circuits and associated supervisory digital processor that controls the operation of such circuits. Thus, the configuration of such circuits and the manner in which they are interfaced with other communication system equipment have, for the most part, been illustrated in the drawings by a readily understandable block diagram, which shows only those specific details that are pertinent to the present invention, so as not to obscure the disclosure with details which will be readily apparent to those skilled in the art having the benefit of the description herein. Thus, the block diagram illustration to be described is primarily intended to show the architecture of the bit synchronizer in a convenient functional block arrangement, whereby the present invention may be more readily understood.

Figure 2:
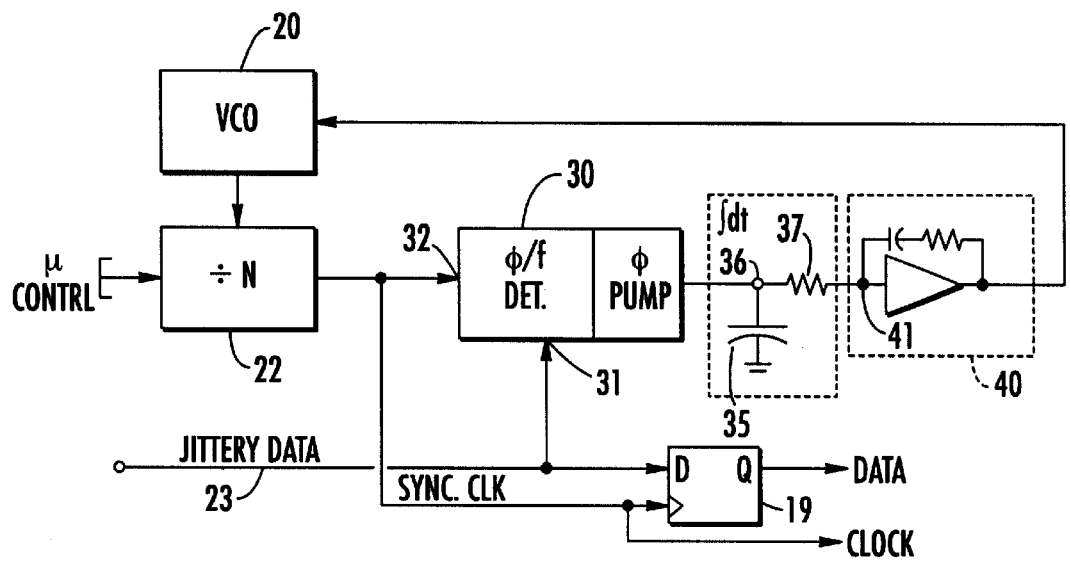
FIG. 2 diagrammatically illustrates a digitally programmable phase locked loop having a phase/frequency detector whose gain constant is proportional to the loop's clock divider ratio.

FIG. 2 diagrammatically illustrates an embodiment of a single PLL-implemented bit synchronizer of the invention, the bandwidth of which can be maintained constant over a substantial baud rate range by making the loop's phase/frequency detector gain constant proportional to the loop's clock divider ratio. As in the architecture of FIG. 1, the improved configuration of the invention includes a stable clock signal generator (voltage-controlled oscillator—VCO) 20, the clock frequency output of which is relatively high compared to the range of data rates capable of being received. As a non-limiting example, for a variable data rate range of 10 kbps–10 Mbps, VCO 20 may be operative to generate a stable 125 MHz output clock signal.

This high frequency clock is selectively (programmably) divided down by a programmable (numerically controlled) frequency divider 22, whose clock divisor ratio N is set by the bit synchronizer's microcontroller in accordance with the data rate of the received signal. As in the conventional circuit of FIG. 1, the output of the programmable divider 22 is a divided down clock signal having the same frequency as the data rate of the received signal, which is coupled from a bit synchronizer input terminal 23 to a first input 31 of a phase/frequency detector 30. A second input 32 of the phase/frequency detector 30 is coupled to receive the divided-down clock signal from the programmable divider 22.

As described briefly above, pursuant to the invention, the phase/frequency detector 30 is implemented to generate its output in the form of a current, the magnitude of which is representative of the frequency difference between the input data signal applied to the input terminal 31 and the clock signal produced by clock divider 22. This is readily effected by incorporating a (current mirror-based) charge pump that is operative to charge a capacitor 35 with the phase/frequency difference representative current.

Rather than directly couple the charging node 36 of capacitor 35 to a loop filter 40 (which is implemented as an operational amplifier-based circuit, as described above with reference to the conventional PLL of FIG. 1), the capacitor 35 is coupled through a resistor 37 to the input node 41 of the loop filter 40. As a consequence, rather than being coupled to an infinite input impedance circuit, because of the coupling resistor 37 between node 36 and loop filter 40, the capacitor 35 sees a circuit having a finite input impedance. This has the effect of coupling a current integrator in circuit between the output of the phase/frequency detector 30 and the loop filter 40.

The effect of this integration function is to produce at node 36 a voltage V that is proportional to (1/C) times the integral of the phase detector output current I over the symbol period Ts, where C is the capacitance of capacitor 35. Since the phase detector's output current I is a non time-varying representation of the phase/frequency difference between the input data signal applied to the input terminal 31 and the clock signal produced by clock divider 22, the voltage V may be defined as (1/C) times Ts.

As described previously, the data symbol period Ts is the inverse of the data rate, so that it effectively corresponds to the ratio of the clock frequency divisor N to the fixed output frequency $f_{vco}$ produced by the VCO 20, i.e., $N/f_{vco}$. The loop bandwidth of the PLL is definable as:

$$\omega_N^2 = \frac{k_{\phi det} * k_{VCO}}{N * \tau_{loopfilt}}$$

where:

$k_{\phi det}$ is the gain constant of phase/frequency detector 30,
$k_{vco}$ is the gain constant of VCO 20, and
$\tau_{Loopfilt}$ is loop filter time constant.

With $k_{\phi det}$ being proportional to N, the contribution of the divisor N to loop bandwidth is effectively canceled, so that the loop bandwidth of the single loop bit synchronizer of the invention can be maintained constant regardless of data rate (which sets N).

While we have shown and described an embodiment in accordance with the present invention, it is to be understood that the same is not limited thereto but is susceptible to numerous changes and modifications as are known to a person skilled in the art, and we therefore do not wish to be limited to the details shown and described herein, but intend to cover all such changes and modifications as are obvious to one of ordinary skill in the art.

What is claimed is:

1. An apparatus for generating an output frequency signal that is synchronized with the clock rate of an input data signal that has a baud rate which may vary over a prescribed range, the prescribed range covering plural orders of magnitude of baud rate variation, comprising:

a clock frequency generator;

a variable divider, from which said output frequency signal is derived, and being operative to divide an output frequency signal generated by said clock frequency generator by a variable divisor and producing therefrom a divided clock signal having a frequency corresponding to said clock rate and which may fall anywhere within said prescribed range;

a phase/frequency detector having a gain constant that is proportional to said variable divider, and including a first input coupled to receive said input data signal, a second input coupled to receive said divided clock signal produced by said variable divider, and an output representative of the phase/frequency difference between said input data signal and said divided clock signal; and a loop filter coupled in circuit with said phase/frequency detector and said clock frequency generator.

2. An apparatus according to claim 1, wherein said clock generator is operative to generate a fixed output frequency signal.

3. An apparatus according to claim 1, wherein said clock frequency generator is operative to generate a fixed output frequency signal that is at least an order of magnitude higher than the highest baud rate of said prescribed range.

4. A method of generating an output frequency signal that is synchronized with the clock rate of an input data signal having a baud rate which may vary over a prescribed range, comprising the steps of:

(a) providing a phase locked loop PLL that includes
a clock frequency generator,
a variable divider, from which the output frequency signal is derived and being operative to divide an output frequency signal generated by said clock frequency generator by a variable divisor and producing therefrom a divided clock signal having a frequency corresponding to said data rate and which may fall anywhere within said prescribed range,
a phase/frequency detector coupled to receive said input data signal and said divided clock signal produced by said variable divider, and being operative to generate an output representative of the phase/frequency difference between said input data signal and said divided clock signal, and
a loop filter coupled in circuit with said phase/frequency detector and said clock frequency generator; and (b) maintaining the bandwidth of said PLL constant over said prescribed range by configuring said phase/frequency detector to have a gain constant that is proportional to said variable divider, and comprising configuring said phase/frequency detector as a phase/frequency detector circuit that is operative to produce an output current in accordance with the phase/frequency difference between said input data signal and said divided clock signal, and an integrator that is operative to generate an output voltage representative of the integral of said output current.

5. A method according to claim 4, wherein said phase detector includes a charge pump that is operative to charge a capacitor with said output current in accordance with the phase/frequency difference between said input data signal and said divided clock signal, and an integrating resistor coupled in circuit with said capacitor and being operative to generate an output voltage representative of the integral of said output current.

6. A method according to claim 4, wherein said clock frequency generator generates a fixed output frequency signal that is at least an order of magnitude higher than the highest baud rate of said prescribed range, and wherein said prescribed range covers plural orders of magnitude of baud rate variation.

7. An apparatus for generating an output frequency signal that is synchronized with the clock rate of an input data signal that has a baud rate that varies over a prescribed range, the apparatus comprising:
   a clock frequency generator;
   a variable divider to divide an output frequency signal generated by said clock frequency generator by a variable divisor and produce therefrom a divided clock signal having a frequency corresponding to said clock rate and which is within said prescribed range;
   a phase/frequency detector having a gain constant that is proportional to said variable divisor, an output representative of a phase/frequency difference between the input data signal and said divided clock signal, and comprising
      a first input to receive said input data signal,
      a second input to receive said divided clock signal produced by said variable divider,
      a phase/frequency detector circuit coupled to said first and second inputs, said phase/frequency detector circuit to produce an output current in accordance with a phase/frequency difference between said input data signal and said divided clock signal, and
      an integrator to generate an output voltage based on an integral of said output current; and
   a loop filter coupled in circuit with said phase/frequency detector and said clock frequency generator.

8. An apparatus according to claim 7, wherein said clock generator generates a fixed output frequency signal.

9. An apparatus according to claim 7, wherein said prescribed range covers plural orders of magnitude of baud rate variation.

10. An apparatus according to claim 7, wherein said clock frequency generator generates a fixed output frequency signal that is at least an order of magnitude higher than the highest baud rate of said prescribed range, and wherein said prescribed range covers plural orders of magnitude of baud rate variation.

11. An apparatus for generating an output frequency signal that is synchronized with the clock rate of an input data signal that has a baud rate which varies over a prescribed range, the apparatus comprising:
   a clock frequency generator;
   a variable divider to divide an output frequency signal generated by said clock frequency generator by a variable divisor and producing therefrom a divided clock signal having a frequency corresponding to said clock rate and which falls within said prescribed range;
   a phase/frequency detector having a gain constant that is proportional to said variable divisor, an output current representative of a phase/frequency difference between the input data signal and said divided clock signal, and comprising
      a first input to receive said input data signal,
      a second input to receive said divided clock signal produced by said variable divider, a capacitor,
      a charge pump to charge said capacitor with said output current, and
      a resistor coupled to said capacitor and said charge pump to generate an output voltage representative of the integral of said output current; and
   a loop filter coupled between said integrating resistor and said clock frequency generator.

12. An apparatus according to claim 11, wherein said clock generator generates a fixed output frequency signal.

13. An apparatus according to claim 11, wherein said prescribed range covers plural orders of magnitude of baud rate variation.

14. An apparatus according to claim 11, wherein said clock frequency generator generates a fixed output frequency signal that is at least an order of magnitude higher than the highest baud rate of said prescribed range, and wherein said prescribed range covers plural orders of magnitude of baud rate variation.

15. A method of generating an output frequency signal that is synchronized with the clock rate of an input data signal having a baud rate which may vary over a prescribed range, comprising the steps of:
   (a) providing a phase locked loop PLL that includes
      a clock frequency generator, said clock frequency generator generating a fixed output frequency signal that is at least an order of magnitude higher than the highest baud rate of said prescribed range, and said prescribed range covering plural orders of magnitude of baud rate variation,
      a variable divider, from which the output frequency signal is derived and being operative to divide an output frequency signal generated by said clock frequency generator by a variable divisor and producing therefrom a divided clock signal having a frequency corresponding to said data rate and which may fall anywhere within said prescribed range,
      a phase/frequency detector coupled to receive said input data signal and said divided clock signal produced by said variable divider, and being operative to generate an output representative of the phase/frequency difference between said input data signal and said divided clock signal, and
      a loop filter coupled in circuit with said phase/frequency detector and said clock frequency generator; and
   (b) maintaining the bandwidth of said PLL constant over said prescribed range by configuring said phase/frequency detector to have a gain constant that is proportional to said variable divider.

\* \* \* \* \*